United States Patent
Luiten et al.

(10) Patent No.: US 11,125,429 B2
(45) Date of Patent: Sep. 21, 2021

(54) FOLDED SHEET METAL HEAT SINK

(71) Applicant: SIGNIFY HOLDING B.V., Eindhoven (NL)

(72) Inventors: Gwendolyn Anita Luiten, Riethoven (NL); Mark Johannes Antonius Verhoeven, Deurne (NL); Patrick Zuidema, Mierlo (NL); Joris Jan Vrehen, Waalre (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 83 days.

(21) Appl. No.: 16/316,252

(22) PCT Filed: Jun. 30, 2017

(86) PCT No.: PCT/EP2017/066319
§ 371 (c)(1),
(2) Date: Jan. 8, 2019

(87) PCT Pub. No.: WO2018/010981
PCT Pub. Date: Jan. 18, 2018

(65) Prior Publication Data
US 2019/0242568 A1      Aug. 8, 2019

(30) Foreign Application Priority Data

Jul. 11, 2016   (EP) .................................. 16178780

(51) Int. Cl.
*F21V 29/76*   (2015.01)
*F21V 29/89*   (2015.01)
(Continued)

(52) U.S. Cl.
CPC ............ *F21V 29/763* (2015.01); *B23P 15/26* (2013.01); *F21V 29/76* (2015.01); *F21V 29/89* (2015.01);
(Continued)

(58) Field of Classification Search
CPC ............ F21V 29/74; F21V 29/76–767; H01L 23/3672; H01L 21/4878; H01L 23/467;
(Continued)

(56) References Cited

U.S. PATENT DOCUMENTS 4,666,545 A * 5/1987 DeGree ............... H01L 21/4803
156/252
4,740,866 A * 4/1988 Kajiwara ............ H01L 23/4332
165/80.4
(Continued)

FOREIGN PATENT DOCUMENTS

CN         204922907 U     12/2015
EP         0779658 A1      6/1997
(Continued)

OTHER PUBLICATIONS

JP-2009026784-A—English machine translation (Year: 2009).*

*Primary Examiner* — Jianying C Atkisson
*Assistant Examiner* — Jose O Class-Quinones
(74) *Attorney, Agent, or Firm* — Daniel J. Piotrowski

(57) ABSTRACT

A finned heat sink, folded from a single piece of plate material, includes a base part and a plurality of fins. The base part includes a plurality of fin extensions and at least one support element. The support element includes bridging parts bridging the inter-fin distances, wherein the bridging parts comprise length reducing parts to thereby reduce those inter-fin distances.

11 Claims, 6 Drawing Sheets

(51) Int. Cl.
*H01L 23/367* (2006.01)
*H01L 21/48* (2006.01)
*F28D 1/02* (2006.01)
*H05K 7/20* (2006.01)
*B23P 15/26* (2006.01)

(52) U.S. Cl.
CPC ........ *F28D 1/0233* (2013.01); *H01L 21/4878* (2013.01); *H01L 23/3672* (2013.01); *H05K 7/20409* (2013.01)

(58) Field of Classification Search
CPC ............... B23P 2700/10; F28D 1/0233; F28D 2021/0029; F28F 2275/14; F28F 2215/00; F28F 2215/10
See application file for complete search history.

(56) References Cited

U.S. PATENT DOCUMENTS

| | | | | |
|---|---|---|---|---|
| 6,138,489 | A * | 10/2000 | Eriksson | B21D 53/02 29/890.03 |
| 6,176,304 | B1 | 1/2001 | Lee | |
| 6,328,098 | B1 * | 12/2001 | Kodumudi | F28F 9/001 165/149 |
| 6,446,709 | B1 * | 9/2002 | Huang | F28F 3/02 165/185 |
| 6,722,419 | B1 | 4/2004 | Lee | |
| 7,166,944 | B2 * | 1/2007 | Einheuser | H02K 11/046 310/64 |
| 7,443,678 | B2 * | 10/2008 | Han | F21K 9/00 361/704 |
| 7,916,485 | B2 * | 3/2011 | Yu | F28F 3/02 361/710 |
| 2004/0052064 | A1 * | 3/2004 | Oliver | H01L 23/4093 361/816 |
| 2007/0012430 | A1 * | 1/2007 | Duke | F28F 1/128 165/109.1 |
| 2008/0310119 | A1 * | 12/2008 | Giacoma | H01L 23/4093 361/719 |
| 2009/0032234 | A1 * | 2/2009 | Wayman | F28F 3/06 165/185 |
| 2010/0157540 | A1 * | 6/2010 | Yu | H01L 23/433 361/710 |
| 2012/0138283 | A1 | 6/2012 | Linderman | |
| 2014/0020882 | A1 * | 1/2014 | Konishi | F28F 3/00 165/185 |
| 2015/0047820 | A1 * | 2/2015 | Rhoden | F28F 3/06 165/182 |
| 2015/0144315 | A1 * | 5/2015 | Chen | F28F 13/00 165/168 |
| 2015/0189791 | A1 * | 7/2015 | Tamura | F28D 1/04 165/148 |
| 2016/0265854 | A1 * | 9/2016 | Rice | F28D 9/0062 |
| 2018/0209635 | A1 * | 7/2018 | Luiten | F28F 3/08 |

FOREIGN PATENT DOCUMENTS

| | | |
|---|---|---|
| EP | 24636903 A1 | 6/2012 |
| EP | 2894954 A1 | 7/2015 |
| JP | 2009026784 A * | 2/2009 |

* cited by examiner

FOLDED SHEET METAL HEAT SINK

CROSS-REFERENCE TO PRIOR APPLICATIONS

This application is the U.S. National Phase application under 35 U.S.C. § 371 of International Application No. PCT/EP2017/066319, filed on Jun. 30, 2017 which claims the benefit of European Patent Application No. 16178780.9, filed on Jul. 11, 2016. These applications are hereby incorporated by reference herein.

FIELD OF THE INVENTION

The invention relates to a finned heat sink, an electronic device comprising a functional component configured in thermal contact with a finned heat sink, a method for producing a finned heat sink, a tool for (facilitating) manufacturing a heat sink, and a method for producing an electronic device comprising a functional component and a finned heat sink.

BACKGROUND OF THE INVENTION

Finned heat sinks are known in the art. EP0779658, for instance, describes a heat sink and heat spreader for mounting on a surface of a semiconductor device package. A heat sink plate has first and second surfaces wherein the first surface serves as a thermal dissipation surface. An adhesive is applied to the second surface of said heat sink plate for adhering the heat sink to the surface of a semiconductor device package.

SUMMARY OF THE INVENTION

Finned heat sinks are used in cooling applications to enlarge the cooling surface. Finned heat sinks are often manufactured by forging, casting, die-casting, or extrusion. These manufacturing methods are bound by a minimum fin thickness to allow for material flow and maximum base dimensions for size of the press and the mold. In addition, enhancing "flowability" of heatsink material is usually at the cost of thermal conductivity, hence die-cast, extrusion and forging alloys typically have lower thermal conductivity.

It is advantageous to have closely packed high and thin fins to have a large cooling surface at a small volume and small weight, but this is hard to achieve in forging, casting, die-casting or extrusion, and hence leads to increased cost. One solution to this problem is to cut fins out of flat plates, and bond the butt end of the plate to a bottom plate, for instance by compression, soldering or brazing. However, the butt end joint of the flat plate fin to the heat sink base is both mechanically and thermally a weak point. Both heat and force have to pass through the small contact area provided by the butt joint between the fin and the bottom plate. Heat flow is severely compromised by less-than-ideal contact in the small area. To attain good thermal contact it may require additional expensive processing, and hence costs are added to ensure such good thermal contact. Mechanical failure of the joint, for instance by handling, compromises the thermal function. Thinner fins have a smaller butt area and are more fragile. Hence, in addition the manufacturing of good quality butt joints is achieved at a cost and for a certain minimum fin thickness.

Alternatively, it is also known that finned surfaces can be made by cutting and bending fins out of a flat plate. Such a heat sink is described in EP0779658 (see above). However, its thermal cooling functioning may be relatively low and it may only be suitably applied for low aspect ratio finned surfaces where the fin height is less than the inter fin distance.

Hence, prior art solutions especially seem to face the contradictions (A) that a flat plate fin must be thick and the fin base must be small sized for manufacturability in extrusion, forging or die casting, but the fin needs to be thin and the base needs to be large for good thermal functioning in relation to the weight and volume of the fin, (B) that the flat plate fin must be thick in order to have a robust contact area and the flat plate fin must be thin in order to have good thermal functioning in relation to its weight and volume, and (C) with respect to stamped and bent flat plate heatsinks the fin height must be large for thermal functioning but the fin height must be small for dense packing of fins.

Hence, it is an aspect of the invention to provide an alternative finned heat sink, which preferably further at least partly obviates one or more of above-described drawbacks. It also is an aspect of the invention to provide a method for producing a finned heat sink, which preferably further at least partly obviates one or more of above-described drawbacks. Further, it is an aspect of the invention to provide a method for producing an electronic device, comprising a functional component and a finned heat sink, which preferably further at least partly obviates one or more of above-described drawbacks. Yet, it is a further aspect of the invention to provide an electronic device comprising a functional component configured in thermal contact with such finned heat sink. In yet a further aspect, the invention provides a tool for bending. Especially the tool may be used in the manufacturing of a finned heat sink as described herein.

Therefore, the invention provides in a first aspect a finned heat sink ("heat sink") folded from a single piece of plate material and comprising a base part and a plurality of fins), each fin having a first end via which said fin is connected to the base part and extends therefrom, and a second, free end opposite to the first end, the fins having a thickness (d1) ("fin thickness") and a height (h1) ("fin height"), with especially d1/h1<1, the fins having inter-fin distances (d2), with especially d2/h1<1, the base part comprising a plurality of fin extensions ("extensions") and a support element, with the fin extensions configured in a plane of the base part and with the fin extensions associated with the support element, wherein the support element includes bridging parts bridging the inter-fin distances (d2), wherein the bridging parts comprise length reducing parts, especially selected from the group comprising a roll, a curve, and at least one angle.

Such heat sink may comprise good thermal functioning in relation to the weight and volume of heat sink. Especially, the heat sink may comprise a large cooling surface in relation to its volume, its size and/or its weight. Especially the fins (of the heat sink) are configured at an inter-fin distance being smaller than the height of the fins. This is possible due to the fact that the length of the heat sink is reduced with the introduction of the length reducing parts. Herein, the term "inter-fin distance" may also refer to a plurality of (different) inter-fin distances (between different (sets of) adjacent fins).

The expression "second, free end" is to be understood as that the fin with its second end is not connected there to adjacent fins.

Especially, the ratio of the inter-fin distance over the height is larger than 0 and smaller than 1, such as selected in the range up to 0.5, especially up to 0.1. Without the length reducing parts, such ratio would be close to 1, such as in the range of 0.9-1. In embodiments, the ratio of the inter-fin distance over the height is at least 0.01, such as selected in the range of 0.01-0.1. The inter-fin distance may especially be selected in the range of 0.5-50 mm, especially in the range of 0.5-15 mm. Especially, the inter-fin distance is less than 30 mm, such as up to 15 mm, such as at maximum 5 mm (and especially larger than 0.1 mm, such as at least 0.5 mm, like at least 1 mm). Hence, a heat sink according to the invention may especially comprise a closely or dense packing of the fins. Herein the terms "close(ly) packing" or "dense packing" relate to a heat sink comprising a ratio of the inter-fin distance over the height being less than 1, especially being less than 0.9. Especially, such heat sink may comprise a large cooling surface (i.e., especially the total surface area of the fins) in relation to the overall volume/size of the heat sink.

The heat sink comprises a plurality of fins extending from the base part. Especially, the heat sink at least comprises two fins. In embodiments, the heat sink comprises more than 2 fins, such as equal to or more than 5 fins, especially equal to or more than 10 fins. In embodiments the number of fins is selected in the range of 10-1000, especially 10-500, such as 10-250, even more especially 10-100, such as 10-50. The plurality of fins may comprise a subset (more than one) of fins, wherein, especially all fins are configured substantially identical. Additionally, the heat sink may comprise different second fins, e.g. fins having different dimensions, such as different fin heights and/or fin widths and/or different shapes, etc. Such second fin(s) may be differently configured. Such second fin(s) may also be differently associated with the base part, e.g., by soldering, welding, or any other type of bonding. Especially, the heat sink comprises a plurality of fins, wherein all single fins of the plurality of fins are configured the same. Herein the term "fin" and "fins" as in "the fins having a thickness", "the fins having an inter-fin distance" and the like, relate to the fins of "the plurality of fins". Especially the term "second fin(s)" may relate to (another) fin, not making part of the plurality of fins (complying with the conditions therefore described herein).

The fins extend from the base part. In embodiments, the fins are configured substantially perpendicular to the base part (at the location where a respective fin extends from the base part). Especially in such embodiments, a maximum distance between the fin and the base part may equal the height of the fin(s), especially wherein the fins comprise straight fins. In other embodiments, such maximum distance may be less than the height of the fin, for instance in embodiments wherein the fin comprises a curved configuration (see below) or wherein the fin is not configured perpendicular to the base part. Especially, herein a height of a fin may relate to a characteristic length of the fin in a direction extending from the base part, especially measured along a face of the fin. Especially, a characteristic dimension of a fin comprising a flat fin and configured perpendicular measured along a line arranged perpendicular to the base part may equal the height of the fin. It will be understood that a fin configured differently (such as comprising a curved shape, or not configured perpendicular to the base part) especially comprises a same or similar characteristic dimension. Especially, the height of a fin relates to said characteristic dimension. Especially, a width (of the fin) and especially a thickness of the fin may relate to a characteristic dimension parallel to the base part (especially at a location where the fin extends from the base part). Especially, the height, width and the thickness relate to three dimensions that are positioned perpendicular to each other. Further, the thickness of the fin is especially defined by a smallest dimension of the fin.

Especially, a fin may have a bottom or base edge, wherein the terms "bottom" and "base" of the fin relate to an edge of the fin configured at the base part, especially at a location where the fins extend from the base part. Especially, the term "top" of a fin may relate to an edge of the fin arranged opposite to the base of the fin. Herein a height may also comprise a plurality of heights. The term "width" may also relate to a plurality of (different) widths. Further, the term "thickness" may also relate to a plurality of (different) thicknesses. Hence, for instance, a single fin may comprise more than one height. Alternatively or additionally, a single fin may comprise a plurality of widths. A fin may for instance comprise a gradually changing width, especially wherein the width at the top may be smaller than the width at the base. Alternatively or additionally, other elements, such as the fin extensions, the support element, and the reducing parts, etc., may comprise a plurality of heights, and/or widths and/or thicknesses. In further embodiments, the fins comprise a plurality of thicknesses. In other embodiments, the fins comprise exactly one thickness. Further, as indicated above, different fins may have mutually different dimensions. Especially, the fins are substantially planar elements, without substantial curves in the plane of the fin. Hence, the fins are especially plate-like elements.

Especially, a heat sink according to the invention may comprise relatively thin fins. In embodiments, the thickness of the fin is selected in the range of 0.1-25 mm, such a 0.2-10 mm, especially 0.5-3 mm. The fin may especially comprise a slender configuration. Especially, the height of the fin may be selected in the range of 5 mm-500 mm, such as in the range of 5 mm-250 mm, especially in the range of 4 mm-150 mm. In other embodiments, the height of the fin may be selected to be equal to or smaller than 5 mm, such as in the range of 1-5 mm.

The heat sink comprises the base part, comprising a plurality of fin extensions and a support element. Especially, the base part has a thickness or height that is substantially smaller than a length and a width. Hence, especially the base part has a substantially planar shape. The base part comprises a plane. The base part, may define a general shape of the heat sink. Such plane does not necessarily have to be a substantially flat plane. In embodiments, for instance, the plane may be a curved plane or a wavy plane. In further embodiments, the plane may at least be a part of a substantial cylindrical plane. In yet further embodiments, the plane may be configured undulated, or may comprise irregularities. Essentially, the plane may comprise many different shapes. However, in specific embodiments the plane is substantially a flat plane. In yet other embodiments, the plane has a cylindrical shape or has the shape of a horizontal cylindrical segment.

The base part especially may provide a mounting surface for a functional component, such as a light source component (see below). Especially, the mounting surface does not comprise the fins. Especially, the mounting surface may be configured facing away from the fins. In embodiments, the base part, especially the part comprising the plane is flexible. Especially, the plane may be configured to a shape of a functional component.

The plurality of fin extensions is configured in the plane of the base part. In embodiments, the fin extension may essentially comprise a part of the plate between two fins that is not bent, or only bent in one direction. Yet, it is understood that if the plane of the base part comprises a curved plane (or any other shape), one or more of the fin extensions may essentially also comprise a part of the curved plane (or of the any other shape). Hence, the (first) edge part between the fin and fin extension may essentially be straight (without curvature), but may in embodiments be comprised by a curved plane. Especially, a fin extension may be configured in physical contact with a fin. Especially, a fin extending from the base part may be associated with a fin extension. A base edge of a fin may be associated with a (respective) fin extension. A single piece of material may for instance provide a fin and (also) at least part of the fin extension. Hence, in embodiments, the thickness of the fin extension may be equal to the thickness of the respective fin (wherein the thickness of the fin extensions is defined perpendicular to the plane (of the base part)). In other embodiments, the thickness of the fin extensions may be larger or smaller than the thickness of the fins. In embodiments, each of the fins of the plurality of fins is related to a respective fin extension of the plurality of fin extensions. Especially, in such configuration the fin extending from the base part may extend from the respective fin extension. Hence, especially the number of fins may equal the number of fin extensions. Especially, the plurality of fins is associated with the plurality of fin extension. Hence, especially the fin extensions and fins are essentially a single piece, with the fin configured under an angle (unequal 180°) with the fin extension.

The base part comprises the plurality of fin extensions and the support element. Hence, especially the fin extensions and support element are essentially a single piece, with optionally the support element configured under an angle (unequal 180°) with the fin extension(s). In embodiments, for instance the support element and the fin extensions comprise a single piece of material.

Hence, especially a height of the base part (a base part height) may be defined by the fin extensions/and or the support element. The base part height may be defined as a characteristic dimension of the base part measured perpendicular to the plane of the base part.

In embodiments, the base part height may be defined by part of the support element (especially the part adjacent to the fin extensions). Part of the support element may substantially completely be configured in the plane of the base part. Especially, in such configuration the base part height may substantially be equal to the thickness of the part of the support element adjacent to the fin extensions. Further, the thickness of the support element is especially defined by a smallest dimension of the support element.

The support element may also substantially completely be configured out of the plane of the base part. Especially, in such configuration the height of the base part may be larger than the thickness of the support element (see below). In such embodiments however, the height of the base part may essentially be the width of the length reducing parts (see below).

Hence, in embodiments, at least a part of the support element, especially the part adjacent to the fin extension, is configured substantially perpendicular to the plane of the base part. In yet other embodiments, at least part of the support element, especially the part adjacent to the fin extension is configured inclined with respect to the plane of the base part. However, in yet other embodiments at least a part of the support element, especially the part adjacent to the fin extension, is configured substantially in the same plane as the base part. Hence, in embodiments the parts of the support element adjacent to the fin extensions may have an angle $\alpha$ with the fin extensions (and the plane of the base part) of 180°, i.e. when the support element is not bent relative to the fin extensions, or substantially any other angle selected from 90-360°. Especially, the angle $\alpha$ is either about 180° or about 270°.

In further embodiments, the support element and the fin extensions comprise a bent configuration with respect to each other. Such configuration may for instance be obtained by bending the support element out of the plane of the base part during manufacturing of the heat sink (leading to an angle $\alpha$ unequal to 1800). Hence, especially the support element may comprise a thickness being equal to the thickness of the fin extensions. In further embodiments, the fin extensions have a fin extension thickness ($d_3$) with $d_3=d_1$, and the support element has a support element thickness ($d_4$) with $d_4=d_1$. In embodiments, each of $d_1$, $d_3$ and $d_4$ is selected in the range of 0.1-25 mm, such a 0.2-10 mm, especially 0.5-3 mm.

A support element may also relate to more than one support elements, such as at least two support elements. In embodiments, different support elements may be configured differently. However, especially the support elements are configured substantially identical.

The support element is associated with the fin extensions. The term "associated" may especially relate to connected elements. The fin elements and the support element may be linked together by a linking part. The fin elements and the support element may also comprise a single piece of material; especially they may be manufactured from a single piece of material.

In embodiments, the heat sink comprises two support elements, especially configured at opposite sites of the fin elements. Especially in such embodiments, the support elements may enclose the fin extensions. In embodiments, the support elements and a fin extension may contact each other at two (respective) edges of the fin extension(s), especially defining a length of the fin extension (s). Hence, in embodiments, the finned heat sink comprises two support elements, wherein two edges, especially defining a fin extension length ($l_1$), are associated with the respective support elements. As indicated above, the support element(s) and the fin extensions may consist of a single piece of material.

A width of the support element may be defined by a dimension of the support element perpendicular to the edge of the support element adjacent to the fin extensions. Hence in embodiments, the height of the base part may be defined by the width of the support element, especially in embodiments wherein the support element is configured perpendicular to the plane of the base plate.

The support element comprises (a plurality of) bridging parts. The bridging parts bridge the inter-fin distance. Herein the term "bridging" and the like especially relate to interlinking or connecting, either directly or indirectly. Hence, the bridging part may physically contact two adjacent fins to bridge the inter-fin distance. The bridging part may also for instance indirectly contact a first fin by physically contacting a fin extension connected to the first fin and directly contacting an adjacent fin to bridge the inter-fin distance between the first fin and the adjacent fin. Yet other options are also possible. Essentially, a bridging part bridges an inter-fin distance between two adjacent fins. Especially the bridging part connects two adjacent fins.

In yet further embodiments, the bridging parts may comprise two bridging part edges that do not contact other elements of the heat sink over at least a largest part of the bridging part edges, especially over two edges of the length reducing elements (see below). This part may essentially relate to the part of the plate from which the fins were bent away. The bridging part may further include the part of the support element adjacent to the fin extension.

A bridging part may especially be configured to provide a mutual distance between two adjacent fins. The bridging parts are especially modified to reduce the inter-fin distance. The reduction of the inter-fin difference may especially be provided by length reducing parts. For instance, at least part of the bridging parts may be (configured to) bent or twisted to reduce an effective length of the bridging parts. Herein especially the term "effective length" may relate to a shortest distance between two adjacent fins bridged by the bridging part. Hence after reducing in a length reducing stage a length of a bridging part (i.e. initial inter-fin distance, see further below), the bridging part may have an effective length that is smaller than the length of the bridging part. Hence, especially the effective length of the bridging part may be reduced due to the introduction of the length reducing parts. Therefore, the bridging part comprises a length reducing part. The term "length reducing part" may also refer to a plurality of length reducing parts.

Hence, in embodiments the bridging part, especially the length reducing part, comprises a roll. In further embodiments, the bridging parts, especially the length reducing parts, comprise a curve. Additionally or alternatively, the bridging parts, especially the length reducing parts, may comprise an angle (substantially unequal to 180°). The bridging parts, especially the length reducing parts, may also comprise any combination of above-mentioned configurations (i.e., a curve, an angle, and a roll). A bridging part may for instance comprise more than one angle, or at least one angle and a roll. Especially all different options are feasible, especially to provide a reduction in the effective length of the bridging part. Such angle may be selected in the range of 0-180°, such as 0-150°, especially an angle may comprise an acute angle, especially selected in the range of 0-45°, such as 0-10°. An angle may also comprise substantially 90°. Especially, embodiments comprising an angle may comprise a V-shape. Hence, in embodiments the length reducing parts are V-shaped. Herein, the V-shape may be configured very narrow as well as very wide; especially the angle of the V may be almost in the range of 0-90°. A V-shape may comprise an acute angle. A V-shape may also comprise a U-shape. For instance, a U-shape may be considered as a V-shape with a curved end. Alternatively the combination of two angles in the length reducing parts may result in the U-shape. In specific embodiments the "angle" is configured gradually. In such instances, the length reducing part may have the shape of a combination of an angle and a curve. Hence, in embodiments the angle may be curved. A V-shape may also include legs forming the V which legs are substantially parallel.

It may especially be advantageous to configure a V-shaped configuration such that the bridging parts, especially the length reducing parts, extend from a plane parallel to the plane of the base part. Especially in such embodiment, the plane of the support element may be configured parallel to the plane of the base part. Hence, in embodiments, the base part has a base part height (h3) and the length reducing parts have a length reducing part width (w1) wherein h3/w1<1. Especially in such embodiment, a width of the heat sink may be defined by the width of the support element(s) plus the (maximum) width of the fins It may also be advantageous to configure the V-shaped configuration with the bridging parts, especially the length reducing parts, extending from a plane arranged perpendicular the plane of the base part and comprising the edge of the fin extensions. Especially, in such configuration the plane of the support element may be configured perpendicular to the plane of the base part, especially wherein the bridging parts, especially the length reducing parts, extend from the plane of the support element. In particular, in such embodiments, the support elements (especially adjacent to the fin extensions) may have an angle α with the fin extensions of substantially 270°. In the latter embodiments, especially a width of the length reducing parts may be define the height of the base part, especially wherein the width of the length reducing part is be defined by the width of the support element.

In further embodiments, bridging parts, especially the length reducing parts, extending from the plane of the support elements may be rearranged towards the remainder of the support element (especially the part of the support element adjacent to the fin extensions), especially be aligned with the remainder of the support element. Especially, the bridging parts, especially the length reducing, parts may be configured to substantially contacting the remainder of support element and/or other bridging parts. Hence in other embodiments the base part has a base part height (h3) and the length reducing parts have a length reducing part width (w1), wherein h3/w1=1. Especially in such embodiments, the width of the heat sink may be defined by the extremes of the length reducing elements.

As indicated above, the bridging parts comprise length reducing parts, especially selected from the group comprising a roll, a curve, and an angle. Hence, the length reducing parts comprise one or more of a roll, a curve, and an angle. The bridging parts may comprise one or more length reducing parts. Further, a length reducing part may comprise one or more of a roll, a curve, and an angle. For instance, the length reducing part may include a combination of an angle and a curve. Further, a roll can be seen as a plurality of curves. The term "roll" may also refer to a roll structure; the term "curve" may also refer to a curve structure; and the term "curve" may also refer to a curve structure.

The heat sink may especially be thermally conductive. The functioning of the heat sink may especially be affected by a combination of the thermal conductivity and a size of, especially the cooling surface area, the heat sink. Herein, the term "thermally conductive" especially refers to a material having a thermal conductivity of at least 0.1 W/(m·K), such as at least 5 W/(m K), such as at least 10 W/(m K), especially at least 100 W/(m K). Especially, the heat sink may comprise a material having a conductivity of at least 0.1 W/(m·K), such as at least 5 W/(m K), such as at least 10 W/(m K), especially at least 100 W/(m K).

Embodiments, especially having a small size, such as having a fin height selected to be at maximum 15 mm, such as at maximum 5 mm, may comprise materials having a thermal conductivity especially selected in the range of 0.1 W/(m·K)-5 W/(m·K).

In general, the fin heights are at least 1 mm, such as at least 2 mm, like at least 4 mm.

In further embodiments, the material is especially selected from the group consisting of aluminum, magnesium, copper, and silver, especially aluminum and/or copper. In embodiments, the material comprises aluminum and/or an alloy thereof. Suitable materials may e.g. one or more of aluminum alloys 1051, 6061, 6063, copper, copper-tungsten, magnesium, stainless steel, steel, silver and combinations of two or more of the afore mentioned. However, other high thermal conductive materials may also be applied. Especially, the heat sink comprises one or more of the aforementioned high thermal conductive materials or another high thermal conductive material. Examples of suitable materials include steel, aluminum, copper, AlN, BN, SiC, etc. (see also above).

Especially, the heat sink may comprise a metal, for example copper or aluminum. A metal may comprise a substantial pure metal. A metal may also comprise an alloy, such as a bronze, brass and aluminum alloys. Additionally or alternatively, the heat sink may comprise another material, for instance graphite, BoronNitride, a heat resistant and thermal conductive plastic or polymer, for example Coolpoly®, polyphenylenesulfide (PPS), or Vespel-SP22 ® (comprising e.g. 40% graphite). The heat sink may also comprise combinations of different materials, for example graphite laminated onto aluminum or copper foil. In embodiments, the heat sink consists of one or more of alumina and copper. In further embodiments, the heat sink comprises steel or stainless steel, e.g. stainless steel type 304 or stainless steel type 316.

Advantageously, the heat sink described herein, may be produced from a single material, especially comprising a flat face (see below). The heat sink especially may be produced from a single plate material, such as a metal plate material. Hence, in embodiments, the finned heat sink consists of a single piece of metal. Especially, the single piece of plate material has a plate thickness $h4$ and each fin is single plated and has a thickness $d1$, wherein $d1$ is equal to $h4$. Especially, such heat sink may comprise the fin thickness being equal to the fin extension thickness, and especially (also) the support element thickness being equal to the fin thickness. Especially, in such heat sink a resistance to heat transfer that may be present at interfaces between different materials may be minimized. In such embodiment, the inter-fin distance may be chosen to be equal to or larger than 2 times the fin thickness. In particular, the inter-fin distance may be chosen to be equal to or larger than the fin extension length plus 2 times the fin thickness.

In a second aspect, the invention provides a method for producing a finned heat sink, especially the (finned) heat sink as described herein, the method comprising: (i) cutting out fins from a plate over a perimeter of each fin except for a first edge part of said perimeter; the plate having a plate thickness ($h4$); (ii) bending said fins over said first edge parts out of a plane (P) of said plate, thereby generating (i) openings in said plate, (ii) said fins having an initial inter-fin distances ($d2^*$), (iii) fin extensions, and (iv) a support element, wherein the fin extensions are associated with the support element, wherein the support element comprises bridging parts bridging the initial inter-fin distance ($d2^*$); and (iii) reducing in a length reducing stage the initial inter-fin distances ($d2^*$) by bending (deforming) at least part of the bridging parts, especially into one or more of a roll, a curve, and an angle, to provide said finned heat sink having inter-fin distances ($d2$), with $d2/d2^*<1$.

Herein the term "perimeter" may relate to the actual perimeter of the fin. The term may also relate to a virtual perimeter: In the method described above, wherein a fin is cut from a plate, especially comprising a plate material, the term especially may refer to a virtual perimeter, wherein the virtual perimeter comprises a fraction of said plate material that is to be removed to cut out the fin, especially to provide a part of the actual perimeter of the fin.

The method especially provides a heat sink comprising a substantially flat base plane ((essentially) provided by the plane of said plate). In embodiments, the method further comprises bending the plate to provide a curved base plane, especially to provide a curved heat sink, even more especially a circular heat sink. A circular heat sink (having the fins extending away from an axis of the circular heat sink, may for instance function as a base for a PCB (printed circuit board) (see also below). In other embodiments, a heat sink comprising a flat base plane may function as a base for a PCB. In yet other embodiments, the method further comprises deforming the plate to provide a non-flat plane of the plate.

Essentially, at least part of the bridging parts is deformed to reduce the length of the inter-fin distance, especially to reduce a length of the heat sink. Especially a deformation of the bridging parts may provide a closely packed high finned (slender) heat sink.

In embodiments, the bridging parts are configured out of the plane (P) of the said plate before the length reducing stage, and the length reducing stage includes bending at least part of the bridging parts especially to provide V-shaped bridging parts. Especially before the length reducing stage, the bridging parts may define an edge of the fin extension. In embodiments, configuring the bridging parts in the plane of said plate before the length reducing stage may comprise bending the bridging parts over said edge of the fin extensions, especially in a direction facing away from the fins.

In further embodiments, the method further comprises bending said V-shaped bridging parts in a direction towards a plane of the bridging parts.

In other embodiments, the bridging parts are configured in the plane (P) of said plate before the length reducing stage, and the length reducing stage includes bending at least part of the bridging parts to provide V-shaped bridging parts, to provide said bridging parts extending from the plane (P), especially at the same side as the fins.

In yet a further aspect, the invention provides a tool for bending ("deforming") (or especially configured for bending) at least part of a bridging part of a finned heat sink comprising a plurality of fins and a base part from which the fins extend, the fins having a thickness ($d1$) and a height ($h1$) with $d1/h1<1$, the fins having initial inter-fin distances ($d2^*$), the base part comprising a plurality of fin extensions and a support element, with the fin extensions configured in a plane (P) of the base part and with the fin extensions associated with the support element, wherein the support element includes said bridging parts bridging the initial inter-fin distances ($d2^*$), the tool comprising a receipt area for hosting the finned heat sink and configured to allow receipt (or movement) of the finned heat sink in said receipt area, and an at least partly open tool part configured to provide space when at least part of a bridging part is being bent.

Especially such tool may facilitate an/or automate the bending of the bridging parts in a length reducing stage as described herein, especially to provide the fins having an inter-fin distance $d2$ with $d2/h1<1$. The tool may especially be used for providing V-shaped bridging parts. Especially, the tool may be used to successively reduce an inter-fin distance between two adjacent fins, and successively transport the finned heat sink allowing a successive inter-fin distance to be reduced. In embodiments, two tools may be used to bend bridging parts configured at opposite sides of the fins. In other embodiments one tool may be configured to bend bridging parts at opposite side of the fins. In embodiments, the tool is configured to bend the bridging parts arranged in a plane of the base part. In other embodiments, the tool is configured to bend the bridging parts arranged outside said plane.

The invention further relates to an electronic device comprising a finned heat sink, especially the finned heat sink as described herein.

Hence, in a further aspect, the invention provides an electronic device, comprising a functional component configured in thermal contact with a finned heat sink, especially the finned heat sink described herein. As indicated above, the term "finned heat sink" may in embodiments also refer to a plurality of finned heat sinks.

The term "thermal contact" may relate to contact with heat, especially generated by the functional component. Hence, thermal contact may relate to convection of heat (from the component to the heat sink). It may also relate to radiation of heat (from the functional component to the heat sink). The term further relates to conduction of heat, especially wherein the functional component is configured in physical contact with the heat sink. Especially the electronic device may be configured to allow one or more of conductive, radiant and convective transport between the functional component and the heat sink. The term "thermal contact" may also in include in physical contact. The term "thermal" contact may also refer to indirect contact, such as a configuration wherein between the items a thermally conductive material is configured, such as a thermally conductive adhesive.

Especially the functional component comprises an electronic component. An electronic component may include an active or a passive electronic component. An active electronic component may be any type of circuit component with the ability to electrically control electron flow (electricity controlling electricity). Examples thereof are diodes, especially light emitting diodes (LED). LEDs are herein also indicated with the more general term solid state lighting devices or solid state light sources. Hence, in embodiments the electronic component comprises an active electronic component. Especially, the electronic component comprises a solid state light source. Other examples of active electronic components may include power sources, such as a battery, a piezo-electric device, an integrated circuit (IC), and a transistor.

In yet other embodiments, the electronic component may include a passive electronic component. Components incapable of controlling current by means of another electrical signal are called passive devices. Resistors, capacitors, inductors, transformers, etc. can be considered passive devices.

In an embodiments, the electronic component may include an RFID (Radio-frequency identification) chip. A RFID chip may be passive or active.

Especially, the electronic component may include one or more of a solid state light source (such as a LED), a RFID chip, and an IC. It is well-known that heat dissipation is important for a functional component comprising high power LED lamps, the LED die or the chip on board (COB) LED can then suitably be mounted on (a mounting surface of) the base part of the finned heat sink according to the invention, especially at a side of the base part facing away from the fins. Especially for electronic components generating a substantial heat, such as a light source, it may be advantageous to configure the electronic component in physical contact with the heat sink. Hence, in an embodiment, the functional component comprises an electronic component, wherein the electronic component comprises a light source configured in physical contact with the finned heat sink.

The term "electronic component" may also refer to a plurality of substantially identical or a plurality of different electronic components.

Especially the electronic device may include LED luminaires, especially high power LED luminaires. In embodiments, the luminaires comprise luminaires for sports and/or area lighting. In further embodiments, the luminaires comprise luminaires for housing design and/or for accent lighting for retail fashion.

The (electronic) device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, or LCD backlighting.

In a specific embodiment, the light source comprises a solid state light source (such as a LED or laser diode). The term "light source" may also relate to a plurality of light sources, such as 2-200 (solid state) LED light sources. Hence, the term LED may also refer to a plurality of LEDs.

Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of light semiconductor light source may be configured on the same substrate. In embodiments, a COB is a multi LED chip configured together as a single lighting module.

The functional component may (alternatively or additionally) comprise electronics for a light source. Especially the electronics may regulate the power to the light source. The electronics may comprise a control system for controlling the light source. The electronics may also be part of a control system controlling the light source. The electronics may also comprise an (internally or externally arranged) sensor to sense a characteristic of the light source or the surrounding of the light source, such as the temperature or the ambient light. The control system may also control a plurality of light sources, especially e.g. light sources providing different colors of light. The electronics may especially control the light source, such as the power and/or the color (temperature) of the light source. The electronics may comprise an LED driver. The electronics for a light source also may generate heat when in operation.

The invention further provides a method for producing an electronic device, especially the electronic device described herein, comprising a functional component and the finned heat sink described herein, the method comprising configuring the electronic device in thermal contact with the finned heat sink.

There are a number of ways to affect or to control the cooling properties of the finned heat sink, for example fin height, fin thickness, fin distance, number of fins, material and surface treatment, including no surface treatment. For example, the material of the heat sink might be varied, which generally is made of metal, for example copper, or aluminum, as steel, or stainless steel, but alternatively heat resistant and thermal conductive plastics or combinations of different materials are possible, for example graphite laminated onto aluminum or copper foil. Another example in the way to affect the cooling properties of the finned heat sink is by adjusting the inter-fin distance, or an angle by which the fins are bent out of plane (of the base part) may be configured in a longitudinal direction of the base part; for example the outer fins are bent less out of plane than central fins, i.e. that outer fins are at a more acute angle with the plane than the central fins that, for example, extend essentially perpendicular to said plane.

Especially advantageous embodiments of the heat sink and the method to produce a heat sink as described herein comprise options as described above.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily on scale.

DETAILED DESCRIPTION OF THE EMBODIMENTS

Figure 1:
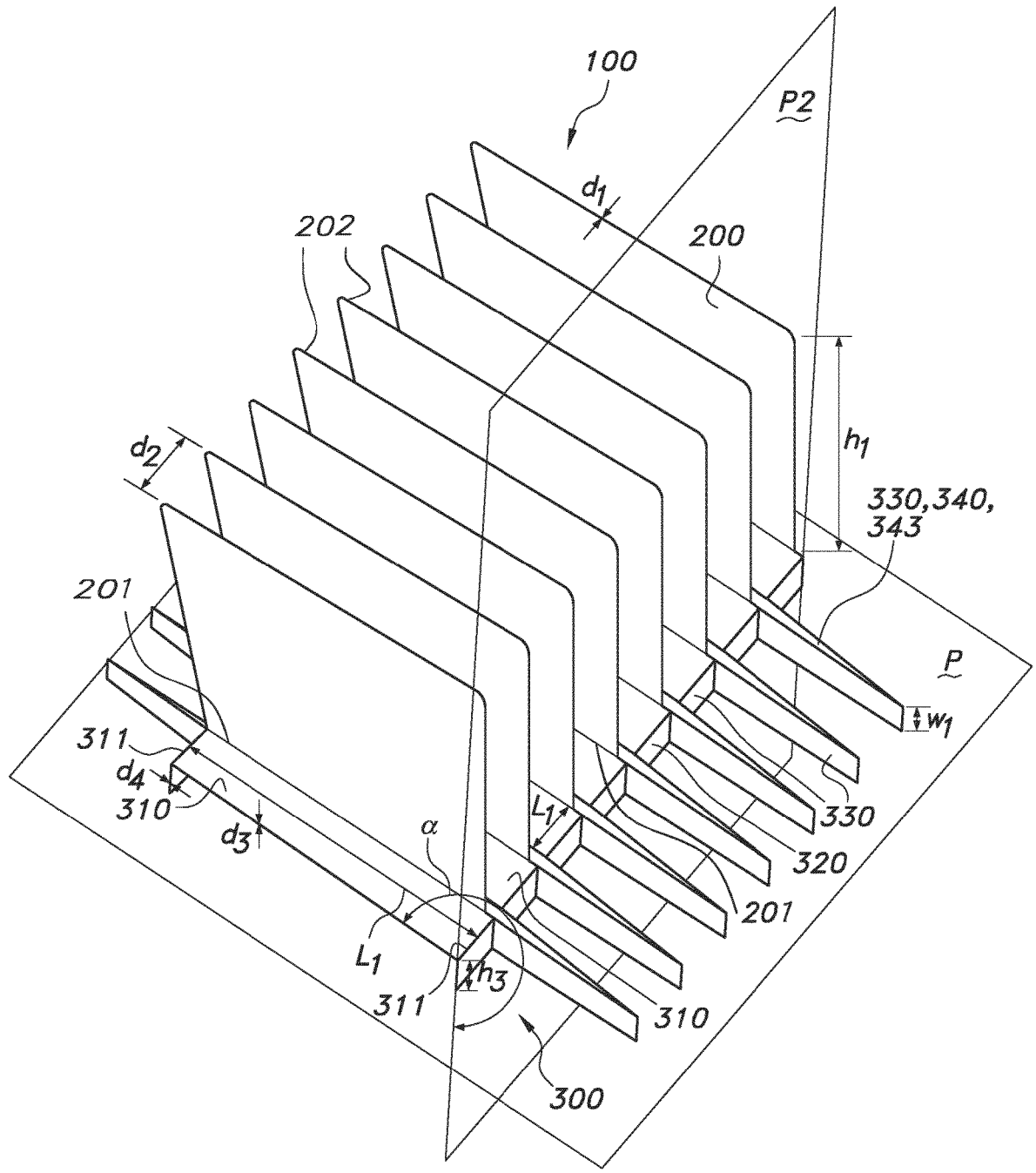
FIG. 1 schematically depicts an embodiment of a finned heat sink according to the invention.

FIG. 1 schematically depicts an embodiment of a finned heat sink 100 according to the invention. The term "finned heat sink" 100 is also referred to herein by the term "heat sink" 100. The heat sink 100 comprises a base part 300 and a plurality of fins 200, each fin having a first end 201 via which said fin is connected to the base part 300 and extends therefrom, and a second, free end 202 opposite to the first end. The fins 200 especially have a thickness d1 and a height h1. Herein the terms "thickness of the fin" "fin thickness" and "thickness" may also be used referring to the thickness d1 of the fins 200.

Especially, the thickness d1 and the height h1 are selected such that the height h1 is larger than the thickness d1 (d1/h1<1). The fins 200 are spaced apart over an inter-fin distances d2. The finned heat sink 100 comprises a closely packed heat think 100, wherein the inter-fin distance d2 is smaller than the height h1 of the fins 200 (d2/h1<1).

The base part 300 comprises a plurality of fin extensions 310, wherein the fin extensions 310 are configured in a plane P of the base part 300. The base part 300 further comprises a support element 320 (here two support elements 320 at both sides of the heat sink 100). The support element 320 includes bridging parts 330 that bridge the inter-fin distances d2. Especially, adjacent fins 200 may be mutually connected by the bridging parts 330. Connecting may be directly or indirectly, e.g. via the fin extensions 310, especially because the fin extensions 310 are associated with the support element 320. The bridging parts 330 especially are configured to define, especially to shorten, the inter-fin distance d2 (especially between two adjacent fins 200). For configuring the inter-fin distance d2, the bridging parts 330 may comprise length reducing parts 340. The length reducing parts 340 may, e.g., comprise (length reducing parts comprising) a roll 341 and/or (length reducing parts comprising) a curve 342, and/or (length reducing parts comprising) an angle 343, see FIG. 5. Essentially, the bridging parts 330 comprise parts adjacent to the fin extensions 310 and length reducing parts 340. In FIG. 1, the length reducing parts 340 may be considered V-shaped. Note that the two legs forming the V-shape are in this schematically depicted embodiment substantially parallel.

The fin extensions 310 may have a fin extension thickness d3 being selected (substantially) equal to the fin thickness d1 (d3/d1=1). In embodiments, the fin extensions 310 and the fins 200 comprise (the same) piece of material, especially that may be bent (in embodiments of the method described herein) such that the fin extensions 310 are configured in the plane P of the base part 300 and the fins 200 extend from the base part 300. Especially, the fins 200 may continue in the fin extensions 310, wherein a fin 200 and a respective fin extension 310 are arranged at an angle. In the depicted embodiment said angle is substantially 90°. The angle however may advantageously in other embodiments be larger or smaller than 90°.

In the depicted embodiment, the support element 320 has a support element thickness d4, being selected (substantially) equal to the fin thickness d1 (d4/d1=1). In embodiments, the fin extensions 310 and the support element 320 comprise (the same) piece of material. Especially, in such embodiments the fin extensions 310 and the support element 320 are associated because they consist of the same piece of material. In other embodiments, the fins may be associated differently, e.g. by welding or gluing.

The (entire) finned heat sink 100 may be manufactured from one single piece of material. Especially, the finned heat sink 100 depicted in FIG. 1 consists of a single piece of metal. The heat sink 100 may e.g. consist of aluminum. In other embodiments, the heat sink 100 essentially consists of copper. In yet other embodiments, the heat sink 100 essentially consists of (stainless) steel. Additionally or alternatively the heat sink 100 may consist of aluminum and copper, such as a metal (alloy) comprising aluminum and copper.

Figure 5:
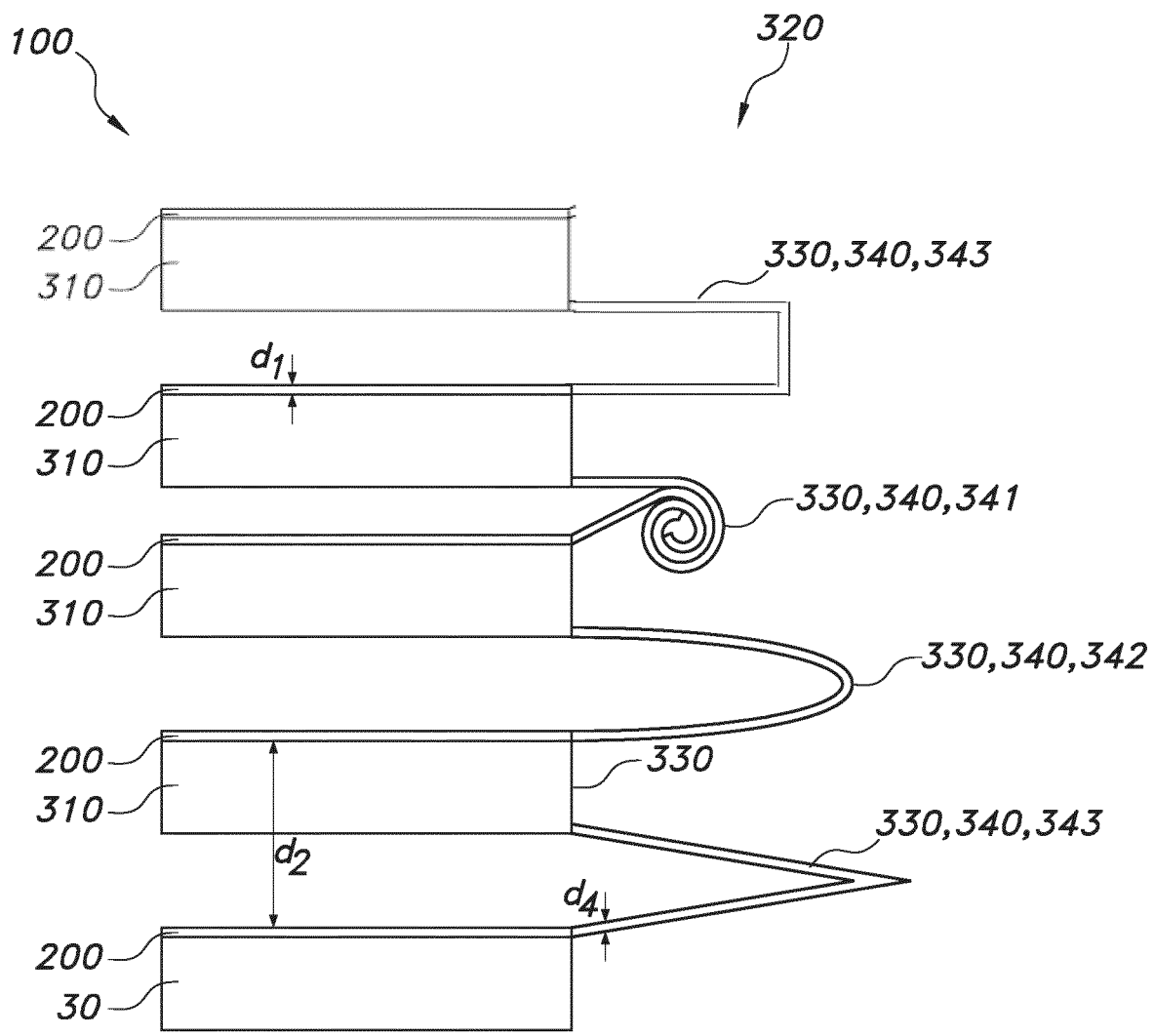
FIG. 5 schematically depicts some further aspects of the finned heat sink.

In embodiments, the heat sink 100 comprises exactly one support element 320, see FIG. 5 schematically depicting a top view of (part of) a finned heat sink 100. In other embodiments, as depicted in FIG. 1, the heat sink 100 comprises two support elements 320. Especially, two edges 311 of the fin extensions 310 that are associated with the respective support elements 320 may define a fin extension length l1.

In embodiments, the support element 320 may be bent with respect to the fin extensions 310. A plane P2 of the support element 320, especially of the bridging parts 330 adjacent to the fin extensions 310, may be configured at an angle α with the plane P of the base part 300. In the embodiment, schematically depicted in FIG. 1, the angle α is substantially 270°. Especially, in the embodiment of FIG. 1, the base part height h3 may be determined by the width w1 of the length reducing parts 340, especially the base part height h3 may equal the length reducing part width (h3/w1=1). In other embodiments (see e.g. FIG. 4), the plane P of the base part 300 is parallel to a plane P2 of support element 320 (and the angle α being substantially 180°). Especially in such embodiment, the base part height h3 may be substantially equal to the support element thickness d4. Hence, the width w1 of the length reducing parts 340 may also be larger than the base part height h3 (h3/w1<1).

Figure 2:
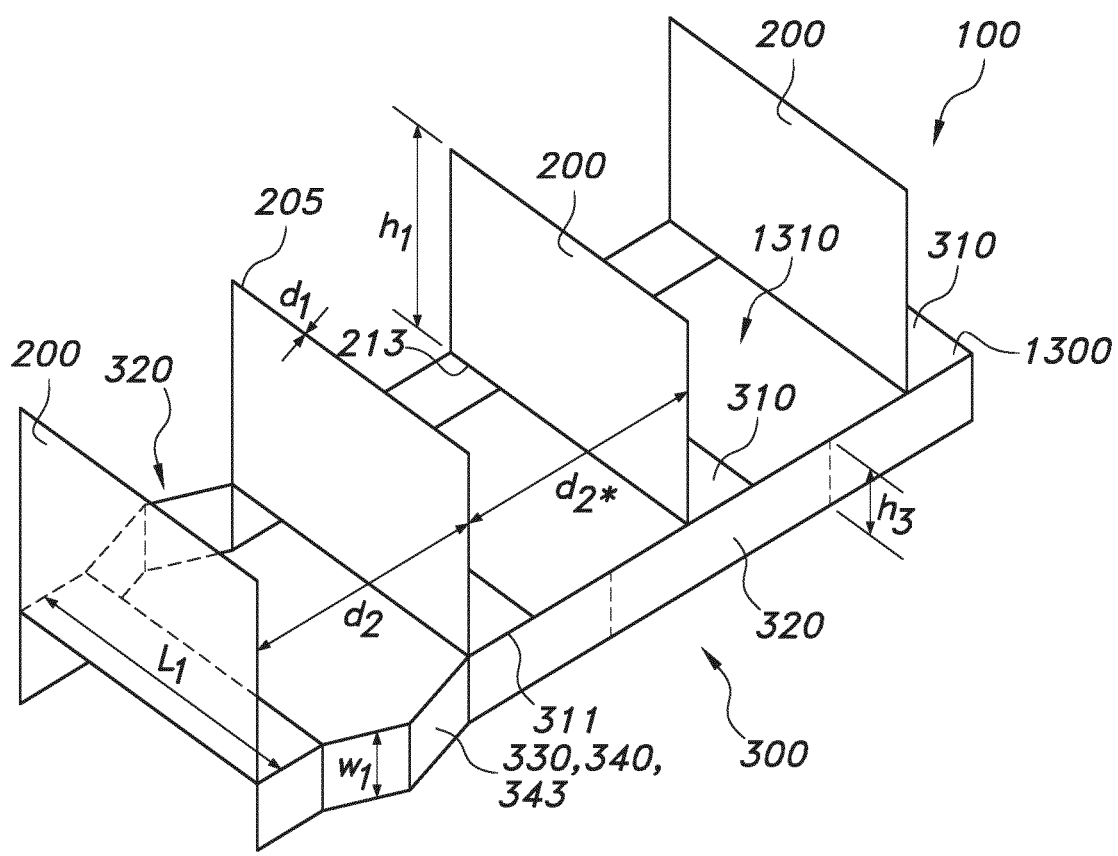
FIGS. 2-3 schematically depict some aspects of the finned heat sink and the method for producing the heat sink according to the invention.
Figure 3:
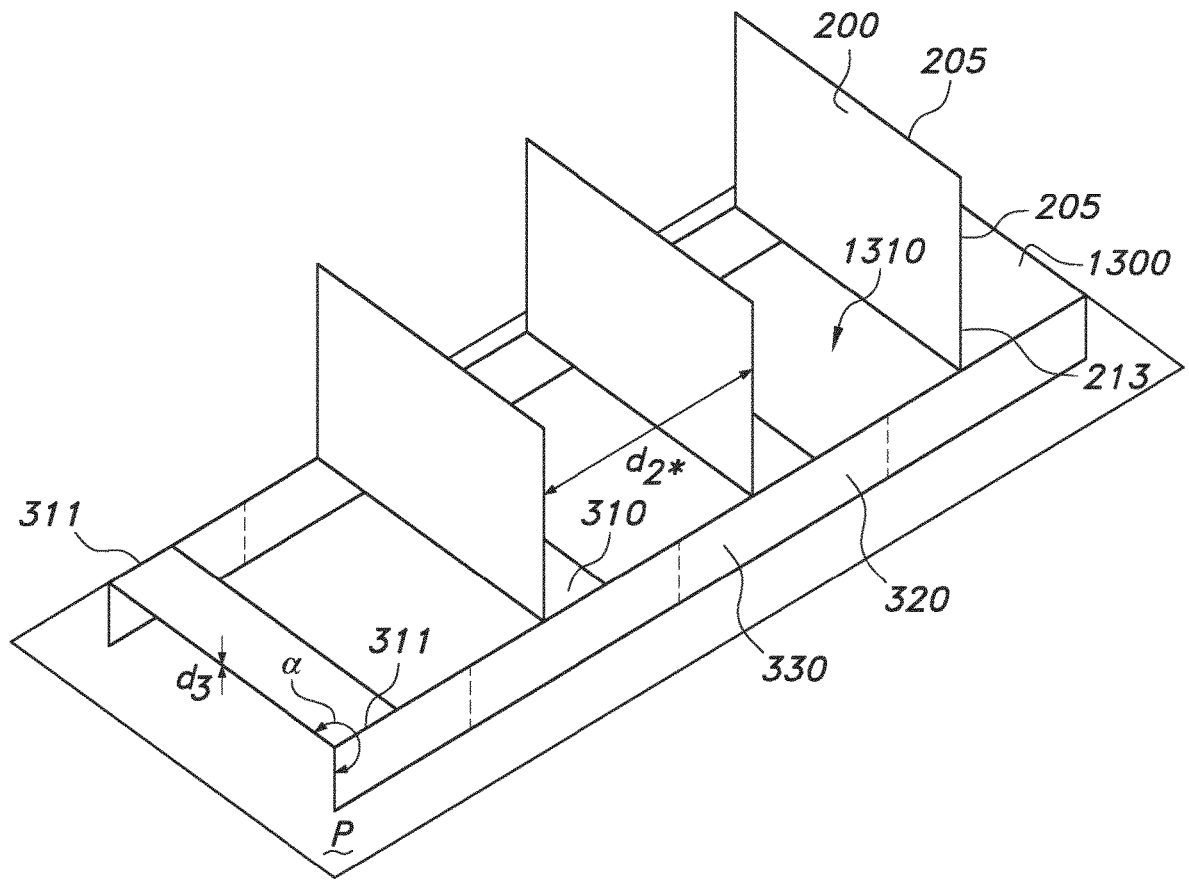
Figure 4:
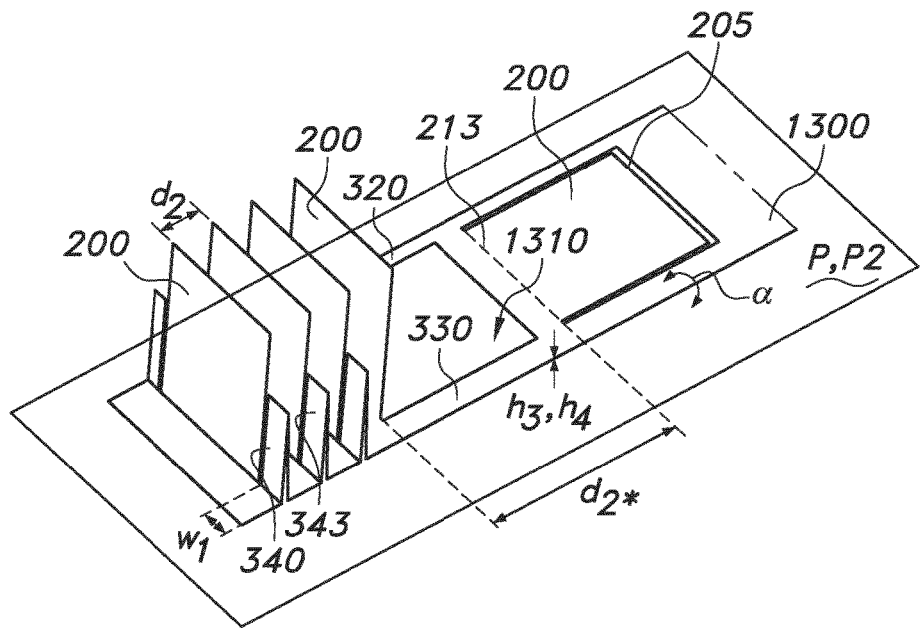

In FIGS. 2, 3, and 4 schematically some aspects of the method for producing a heat sink 100 are depicted. At the same time, these figures schematically illustrate some aspects of the heat sink 100.

The method described herein comprises multiple stages. In a first stage, fins 200 are cut out from a plate 1300, having a thickness h4, over a perimeter 205 of each fin 200 except for a first edge part 213 of the perimeter 205. In a next stage the fins 200 are bent over the first edge parts 213 out of a plane P of the plate 1300. By bending the fins 200 over the first edge parts 213, openings 1310 are generated in the plate 1300 and the fins 200 are provided having an initial inter-fin distances d2*. Also in the plane P of the plate 1300, fin extension 310 and a support element 320 are provided. The fin extensions 310 are associated with the support element 320, especially the fin extensions 310 and the support element contact teach other, especially because they are manufactured out of one plate 1300. The support element 320 further comprises bridging parts 330 bridging the initial inter-fin distance d2*. Optionally the bridging parts 330 are re-arranged with respect to the fin extensions 310 (compare e.g., FIG. 4 with FIGS. 2 and 3, see further below). The next stage comprises a length reducing stage, wherein the initial inter-fin distances d2* is reduced, especially to the inter-fin distance d2, by bending at least part of the bridging parts 330 to provide the finned heat sink 100 having inter-fin distances d2, with d2/d2*<1. In the embodiments schematically depicted in FIGS. 2 and 4 at least part of the bridging parts 330 is bent in an angle 343. Such angle 343 may be any angle 343 selected in the range of substantially 0°-substantially 180°, especially not including 0° and 180°, see e.g. the embodiments depicted in FIGS. 1 and 4 depicting heat sinks 100 wherein the length reducing parts 340 are V-shaped, especially wherein the angle 343 is almost 0° and the relative length after reduction is much smaller than 1 (d2/d2*<<1). In other embodiments the angle 343 may be in the range of 90-180°, see e.g. FIG. 2. Because of the length reducing stage, d2 is essentially smaller than d2*. In other embodiments, in the length reducing stage at least part of the bridging parts 330 is bent in a roll 341 and/or a curve 342, see, e.g. FIG. 5.

It is further noted, that in the embodiment depicted in FIG. 4, the support element 320, especially the bridging parts 330 are configured in the plane P of the plate 1300 (and in the plane P2 of the base parts 320; (α=180°)) before the length reducing stage. After the length reducing stage, the plane P2 of the support element 320 may still be configured parallel to the plane of the plate 1300. The bridging parts 330 comprising a V-shape (however) may be configured out of the plane P of the plate 1300. The V-shaped bridging parts 330 may especially extend from that plane P of the plate 1300, such as at the same side as the fins 200. In the embodiments depicted in FIG. 2, the bridging parts 330 are configured out of the plane P of the plate 1300 before the length reducing stage. Also during manufacturing of the embodiment depicted in FIG. 1, the bridging parts 330 may have been configured out of the plane P of the plate 1300 before the length reducing stage (whereas in the finned heat sink 100 the bridging parts are configured in the plane P of the base part 300).

It is noted that especially in FIGS. 2, 3, and 4 different stages of the method are depicted in the same figure. Especially these stages are performed sequentially.

FIG. 5 depicts schematically a top view of a heat sink 100 by way of example comprising a plurality of different length reducing parts 340, especially comprising an embodiment of a plurality of angles 343 (top) to form a U-shape though it could also be used to form other shapes, for example a W-shape or Y-shape, an embodiment of a roll 341 (sub-top), an embodiment of a curve 342 (sub-bottom), and an embodiment of a single angle 343 (bottom). The embodiment comprises one support element 320, comprising the bridging parts 330. The shape of the length reducing part 340 of the middle bridging part 330 may also be indicated as U-shape, as a U-shape may include the curve 342.

Figure 6:
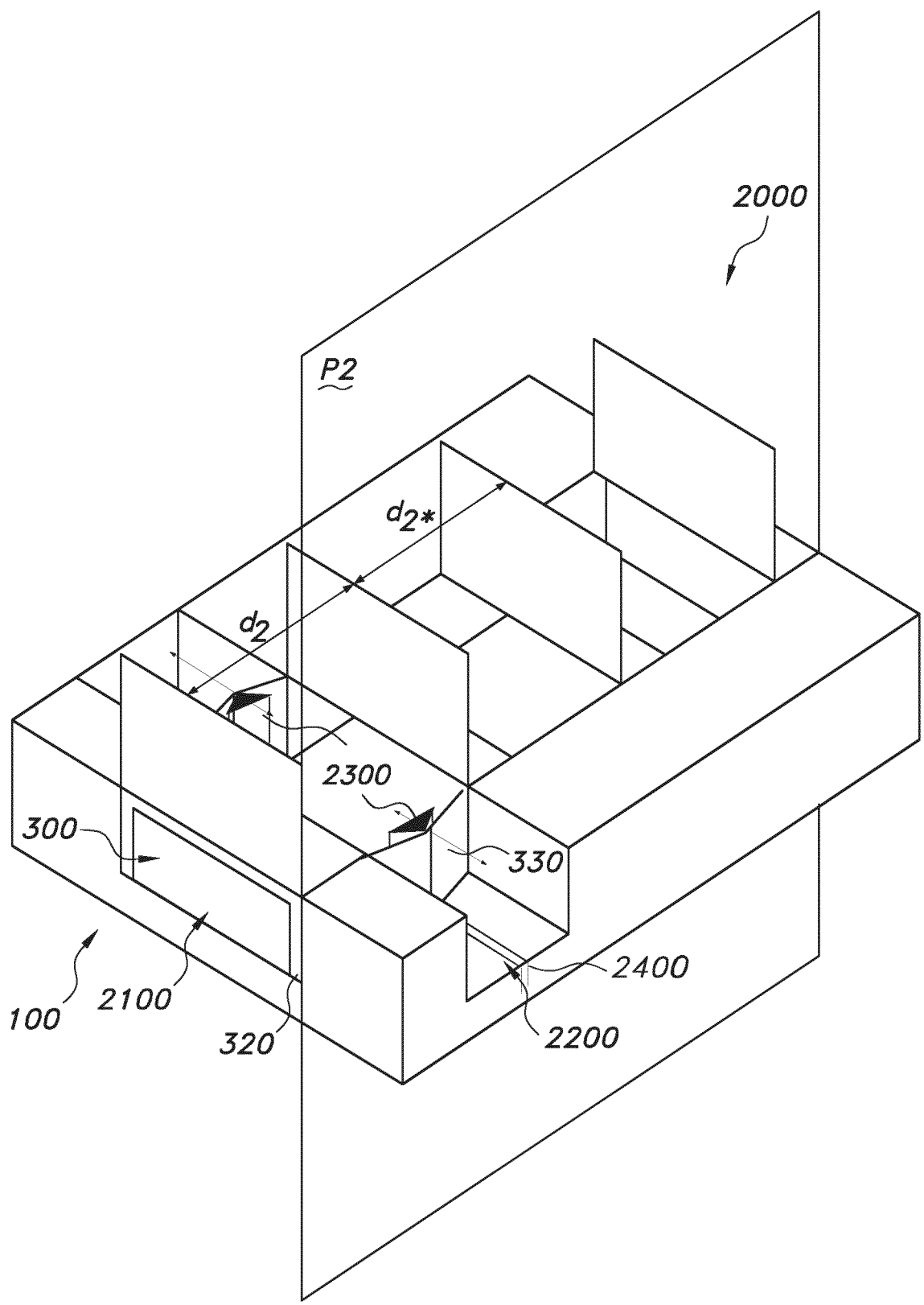
FIG. 6 schematically depicts some further aspects of an embodiment of the method and a tool for bending.

FIG. 6 schematically depicts an embodiment of a tool 2000 for bending at least part of a bridging part 330 of a finned heat sink 100 comprising a plurality of fins 200 and a base part 300 from which the fins 200 extend. Before bending, the fins 200 have an initial inter-fin distances d2*. The tool 2000 comprises a receipt area 2100 for hosting the finned heat sink 100 and an at least partly open tool part 2200. The receipt area 2100 is configured to allow receipt of at least part of the finned heat sink 100 in the receipt area 2100. The open tool part 2200 is configured to provide space when at least part of a bridging part 330 is being bent, especially to allow the V-shaped bridging part 330 or a curved bridging part 330 to extend from a plane P2 of the support element 320. Optionally the tool 2000 may further comprises two movable deformers 2300 to bend the bridging parts outwardly, the deformers are each movable in a respective guiding slot 2400.

Figure 7:
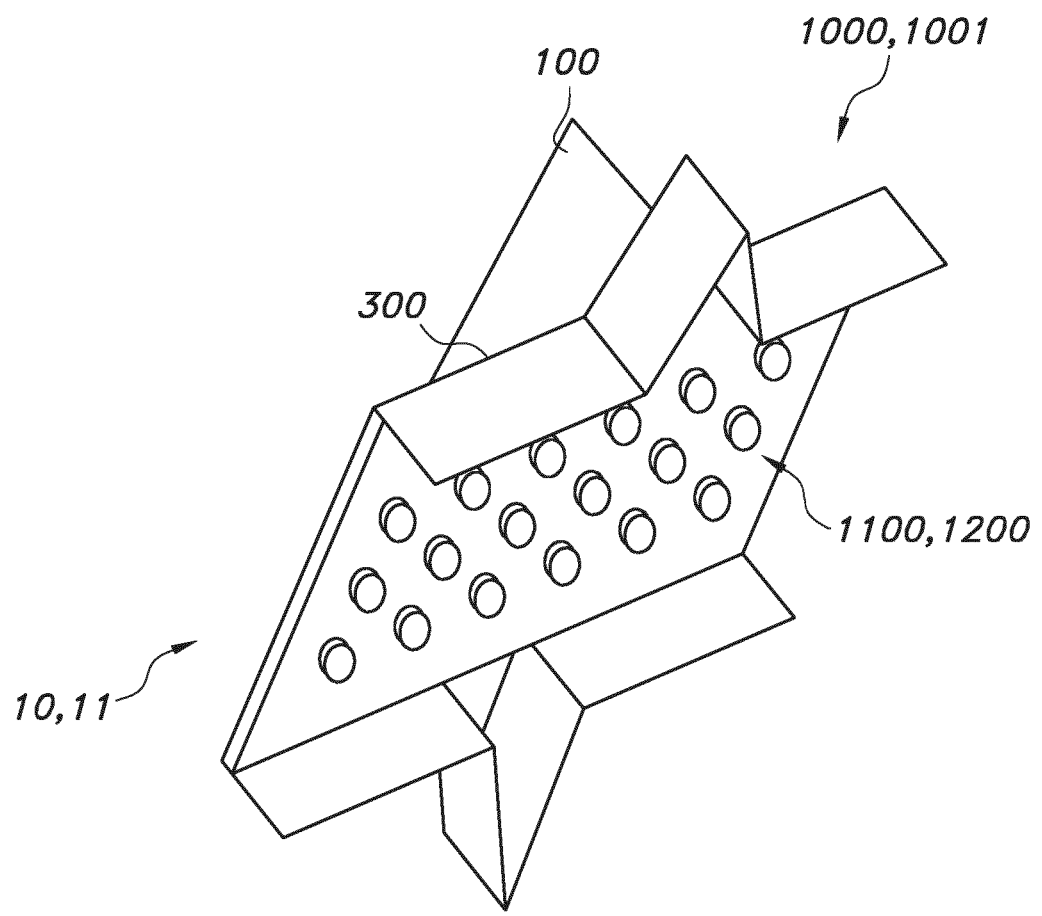
FIG. 7 schematically depicts an embodiment of an electronic device comprising a heat sink.

FIG. 7 schematically depicts an embodiment of an electronic device 1000, especially a (partly exploded) spot luminaire 1001, comprising a functional component 1100 configured in thermal contact with the finned heat sink 100. Herein thermal contact especially relates to allowing heat to be transported, such as by convention, and/or conduction, and/or radiation. To improve heat transport, the electronic device 1000, e.g., may also comprise a forced air flow, such as provided by a fan (not shown). A functional component 1100 according to the invention may comprise an electronic component 1200, especially a passive and/or an active electronic component. In the embodiment of FIG. 7, the spot luminaire 1001 comprises a light source 10, especially comprising a solid state light source, such as an LED 11. In the depicted embodiment, the base part 300 of the finned heat sink 100 comprises a mounting surface for the functional component 1100. The heat sink 100 is mounted on the light source 10 (or vice versa, the light source 10 is mounted on the heat sink 100) to provide a physical contact between the light source 10 and the heat sink 100, allowing the heat generated by the light source 10 to be dissipated easily by the heat sink 100, especially by conduction.

Referring to amongst others the above figures, in embodiments, each of d1, d3, d4 and h4 may be selected in the range of 0.1-25 mm, such a 0.2-10 mm, especially 0.5-3 mm. In embodiments, they may all substantially be identical.

The term "substantially" herein, such as in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A finned heat sink folded from a single piece of plate material having a plate thickness (h4) and comprising a base part and a plurality of fins, each fin having:
    a first end via which said fin is connected to the base part and extends therefrom, and
    a second, free end opposite to the first end, the fins having a thickness (d1) equal to the plate thickness (h4) and a height (h1) with d1/h1<1, the fins having inter-fin distances (d2) with d2/h1<1, the base part comprising a plurality of fin extensions and a support element, with the fin extensions configured in a plane (P) of the base part and with the fin extensions associated with the support element, wherein the support element comprises non-bridging parts and bridging parts, the latter bridging the inter-fin distances (d2), wherein the bridging parts comprise length reducing parts comprising a curve and each fin being a plate-like, single plated element;
    said non-bridging parts of the support element formed by having been bent with respect to the fin extensions, thereby establishing a support element height (h3) relative to the base part wherein the support element height (h3) is greater than the support element thickness (d4).

2. The finned heat sink according to claim 1, wherein the finned heat sink consists of a single piece of metal.

3. The finned heat sink according to claim 1, with the fin extensions having a fin extension thickness (d3) with d3=d1, and with the support element having a support element thickness (d4) with d4=d1.

4. The finned heat sink according to claim 1, wherein the base part has a base part height (h3) and wherein the length reducing parts have a length reducing part width (w1) wherein h3/w1=1.

5. The finned heat sink according to claim 1, wherein the length reducing parts are V-shaped.

6. The finned heat sink according to claim 1, comprising an additional support element, wherein two edges defining a fin extension length (l1) are associated with the respective support elements.

7. The finned heat sink according to claim 1, consisting of one or more of aluminum and copper.

8. An electronic device comprising a functional component configured in thermal contact with the finned heat sink according to claim 1.

9. The electronic device according to claim 8, wherein the functional component comprises an electronic component, wherein the electronic component comprises a light source configured in physical contact with the finned heat sink.

10. The finned heat sink according to claim 1, wherein the length reducing parts are U-shaped.

11. The finned heat sink according to claim 1, wherein said non-bridging parts of the support element are bent at an angle essentially perpendicular to the base part.

* * * * *